(12) United States Patent
Chosa et al.

(10) Patent No.: US 7,455,441 B2
(45) Date of Patent: Nov. 25, 2008

(54) LINEAR LIGHT SOURCE, METHOD FOR MANUFACTURING THE SAME AND SURFACE EMITTING DEVICE

(75) Inventors: Yoshihiko Chosa, Kagoshima (JP); Tadaaki Ikeda, Kagoshima (JP); Koji Hidaka, Kagoshima (JP)

(73) Assignee: Panasonic Corporation, Osaka (JP)

( * ) Notice: Subject to any disclaimer, the term of this patent is extended or adjusted under 35 U.S.C. 154(b) by 267 days.

(21) Appl. No.: 10/573,877

(22) PCT Filed: Jan. 14, 2004

(86) PCT No.: PCT/JP2004/000210

§ 371 (c)(1),
(2), (4) Date: Mar. 29, 2006

(87) PCT Pub. No.: WO2005/031883

PCT Pub. Date: Apr. 7, 2005

(65) Prior Publication Data

US 2007/0109792 A1 May 17, 2007

(30) Foreign Application Priority Data

Sep. 29, 2003 (JP) ............................. 2003-337207

(51) Int. Cl.
*F21V 7/04* (2006.01)
(52) U.S. Cl. ...................... 362/608; 362/609; 362/631; 349/98
(58) Field of Classification Search ................ 362/217, 362/219, 221, 222, 225, 236, 237, 240, 241, 362/246, 247, 327, 612, 613, 615, 630, 631, 362/800; 257/98–100, 787–790; 349/61, 349/62, 65, 67, 68
See application file for complete search history.

(56) References Cited

U.S. PATENT DOCUMENTS 4,941,072 A * 7/1990 Yasumoto et al. ........... 362/249

(Continued)

FOREIGN PATENT DOCUMENTS

JP 63-24858 2/1988

(Continued)

OTHER PUBLICATIONS

Japanese Office Action with English Translation, issued in corresponding Japanese Patent Application No. 2003-337207, issued on Nov. 13, 2007.

*Primary Examiner*—Hargobind S Sawhney
(74) *Attorney, Agent, or Firm*—McDermott Will & Emery LLP (57) ABSTRACT

A linear light source includes light emitting elements 5 which are arranged on a square rod-shaped printed board 4 along the longitudinal direction thereof and reflectors 6 which are arranged alternately with the light emitting elements 5. The opposing surfaces 6a of the reflectors 6 sandwiching the light emitting element are inclined such that the distance between the opposing surfaces of the reflectors increases in the direction of light emitted from the light emitting element 5. The linear light source further includes resin seal layers 10 which are in the form of a trapezoidal prism or a truncated pyramid and formed by filling recesses, each of which is defined by the printed board 4, light emitting element 5 and reflectors 6, with a light-transmissive resin sealant. A strip-shaped reflection member made of a reflection sheet 1 or a vapor-deposited film 12 is arranged to cover a region ranging from the end face of the printed board 4 adjoining to the component side to the tips of the reflectors 6.

11 Claims, 6 Drawing Sheets

U.S. PATENT DOCUMENTS

| | | | |
|---|---|---|---|
| 6,874,910 B2 * | 4/2005 | Sugimoto et al. | 362/294 |
| 6,909,123 B2 * | 6/2005 | Hayashimoto et al. | 257/98 |
| 6,930,332 B2 * | 8/2005 | Hashimoto et al. | 257/98 |
| 2003/0006469 A1 * | 1/2003 | Ellens et al. | 257/432 |
| 2004/0211970 A1 * | 10/2004 | Hayashimoto et al. | 257/98 |

FOREIGN PATENT DOCUMENTS

| | | | |
|---|---|---|---|
| JP | 63-159859 U | | 10/1988 |
| JP | 2-37784 | | 2/1990 |
| JP | 5-38627 U | * | 5/1993 |
| JP | 7-199829 | | 8/1995 |
| JP | 11-053919 | | 2/1999 |
| JP | 11-260122 | | 9/1999 |
| JP | 2000-138397 | | 5/2000 |
| JP | 2001-067917 | | 3/2001 |
| JP | 2002-043630 | | 2/2002 |

* cited by examiner

LINEAR LIGHT SOURCE, METHOD FOR MANUFACTURING THE SAME AND SURFACE EMITTING DEVICE

This application is the U.S. National Phase under 35 U.S.C. § 371 of internaional Application No. PCT/JP2004/000210, filed Jan. 14, 2004, which in turns claims the benefit of Japanese Application No. 2003-337207, filed Sep. 29, 2003, the disclosures of which Applications are incorporated by reference herein in their entirety.

TECHNICAL FIELD

The present invention relates to a linear light source which is applicable to, for example, backlights for liquid crystal display panels of cellular phones and digital cameras and surface emitting devices.

BACKGROUND ART

Figure 6:
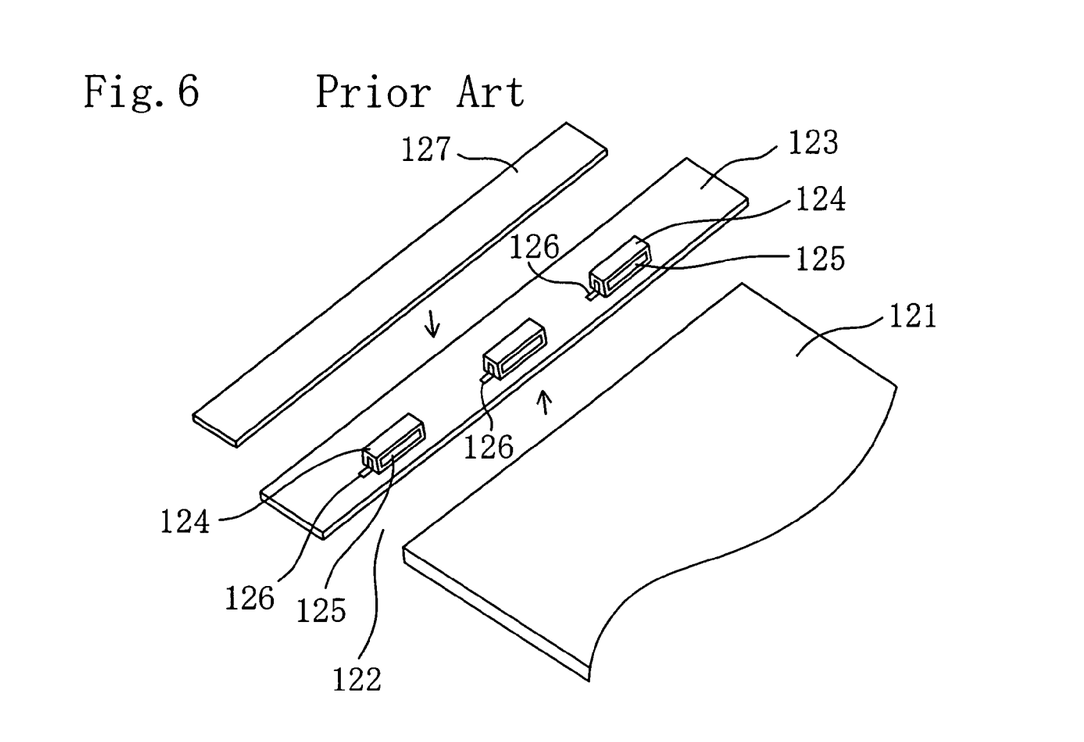
FIG. 6 is an oblique view illustrating a surface emitting device according to the first conventional embodiment.
Figure 7:
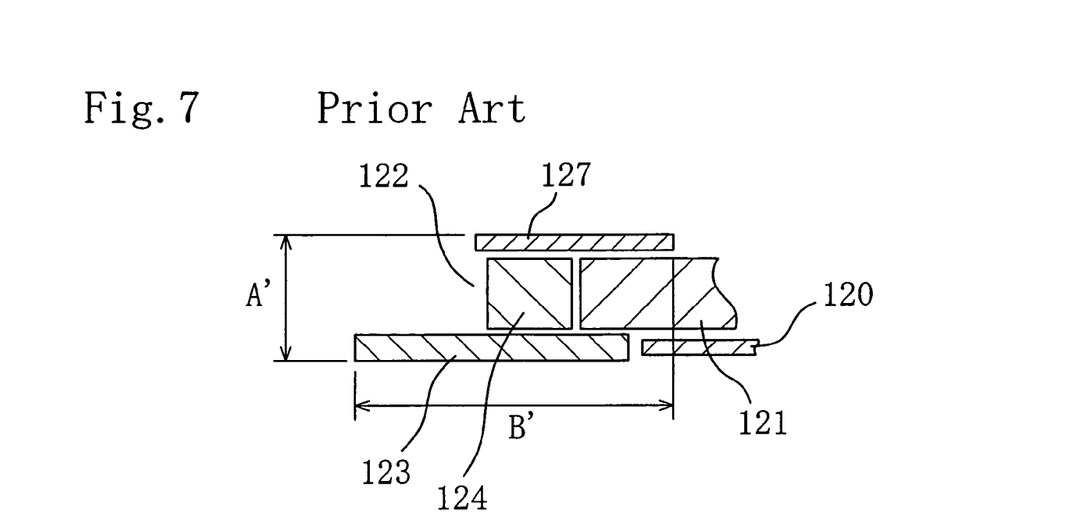
FIG. 7 is a vertical section of a major part of the first conventional embodiment illustrating how a light emitting element is mounted and how a light guide plate and a flexible substrate are connected.

As shown in FIGS. 6 and 7, a first conventional embodiment of a light source and a surface emitting device includes a wide bottom reflection sheet 120 arranged at a liquid crystal display section of a cellular phone or a digital camera, a light guide plate 121 formed on the top surface of the bottom reflection sheet 120 and protrudes at one end from one end of the bottom reflection sheet 120, a light source 122 arranged to face the side surface of the light guide plate 121 and a top reflection sheet 127 covering the end of the light emitting surface of the light guide plate 121 and the light source 122 from above.

The light source 122 includes a narrow flat flexible plate 123 which overlaps with the protruding end of the light guide plate 121 and serves as a wiring board, horizontally oriented rectangular parallelpiped cases 124 which are arranged on the flexible substrate 123 to be close to the side surface of the light guide plate 121, light emitting elements (not shown) contained in the cases 124, respectively, and transparent, light-transmissive resin seal layers 125 that fill the cases 124, respectively.

In each of the cases 124, a face parallel to the side surface of the light guide plate 121, i.e., a light exit face has an opening. A resin sealant is introduced from the opening into the case 124 to close the opening. At the side plane of each of the cases 124, a lead terminal 126 for electrical conduction of the light emitting elements is drawn out and electrically connected to a wiring pattern on the flexible substrate 123 by soldering.

Light from the light emitting elements comes out of the light exit faces of the cases 124 and enters the light guide plate 121. A portion of light leaking from the top and bottom planes of the cases 124 is reflected from the top reflection sheet 127 to be incident on the light guide plate 121. As the light is not wasted, the luminance of the light emitting surface of the light guide plate 121 improves.

Figure 8:
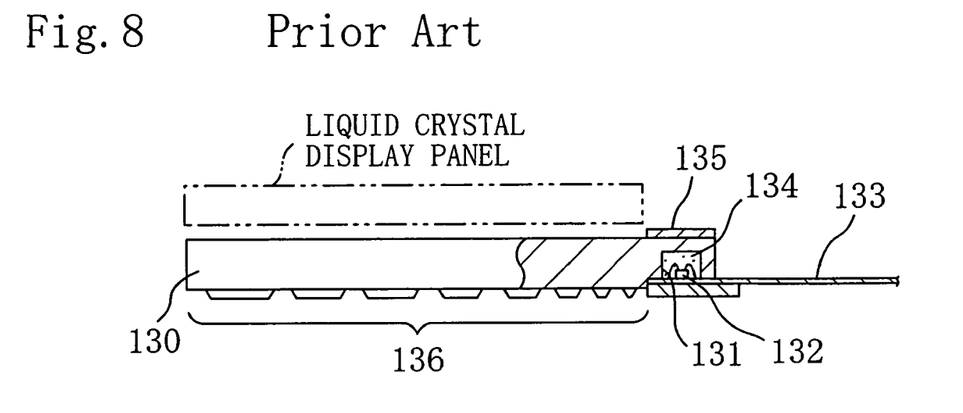
FIG. 8 is a side view illustrating a surface emitting device according to the second conventional embodiment, partially broken away.
Figure 9:
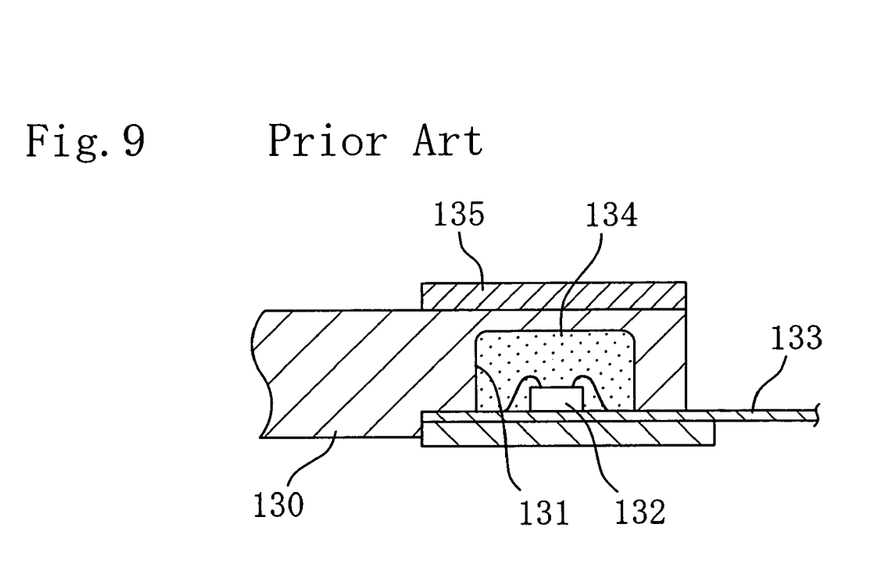
FIG. 9 is a vertical section of a major part of the second conventional embodiment illustrating how a light emitting element is mounted and a light guide plate and a flexible substrate are connected.

A second conventional embodiment of the surface emitting device is shown in FIGS. 8 and 9. In the surface emitting device, recesses 131 for containing light emitting elements 132, respectively, are formed at the end of a light guide plate 130. Each of the light emitting elements 132 is mounted on a narrow flat flexible substrate 133 serving as a wiring board and placed in the recess 131 such that the light exit face of the light emitting element 132 faces the same direction as the light emitting surface of the light guide plate plane 130. The light emitting surface of the light guide plate 130 faces a liquid crystal display panel depicted in the figure by alternate long and short dashed lines. A resin seal layer 134 is formed in each of the recesses 131 of the light guide plate 130 to fill the space around the light emitting element 132. A top reflection sheet 135 having the same width as the recesses 131 is formed on the end of the light emitting surface of the light guide plate 130 and a dot pattern 136 is formed on the bottom surface of the light guide plate 130 except the recesses 131.

A portion of light emitted from the light emitting elements 132 is reflected from the top reflection sheet 135 to the inside of the light guide plate 130. In the light guide plate 130, light directly entered from the light emitting element 132 and light reflected from the top reflection sheet 135 are diffused by the dot pattern 136. Accordingly, the light emitting surface of the light guide plate 130 achieves light emission with uniform luminance. The structure of the conventional light emitting element is disclosed, for example, by Japanese Unexamined Patent Publication No. 2001-67917, pp. 3-6 and FIGS. 2 and 3.

Problem to Solve

As to the first conventional embodiment of the surface emitting device, however, the light emitting elements are contained in the cases 124. Therefore, light from the light emitting elements is cut off by the top, bottom right and left walls of the cases 124. As a result, the range of light distribution by the light emitting elements is reduced to cause hot spot and the luminance is likely to vary. Further, since the lead terminals 126 of the light emitting elements are soldered to the flexible substrate 123, the height A' of the surface emitting device increases and the device cannot be slimmed down.

Moreover, as the cases 124 including the light emitting elements are soldered to the flexible substrate 123, it is difficult to improve packaging accuracy. Specifically, it is not easy to arrange the light emitting elements such that the light axes thereof are orthogonal to the light exit planes of the cases 124 (side surface of the light guide plate 121). The horizontal light axes of the light emitting elements contained in the cases 124 are likely to be misaligned with the longitudinal center line of the side surface of the light guide plate 121. This brings about decrease in efficiency in capturing the light into the light guide plate 121.

Further, as the flexible substrate 123 extends to the end of the light guide plate 121, the amount of light reflected from the bottom reflection sheet 120 is reduced. Therefore, the efficiency in capturing the light into the light guide plate 121 further decreases.

In addition, the width B' of space for the light source 122 is determined depending on the size of the flexible substrate 123. Accordingly, it is difficult to reduce the entire size of the device.

Further, there is a limit in changing the light distribution of the light emitting elements with the side walls of the cases 124. In particular, when the number of the light emitting elements is reduced, the luminance varies significantly.

In the case of the second conventional embodiment of the surface emitting device, there is also a limit in increasing the efficiency in capturing the, light into the light guide plate 130. Therefore, the surface emitting device decreases in utilization efficiency of light.

Moreover, as certain space is required to achieve reflection of the light of the light emitting elements 132 on the top reflection sheet 135, the slimming down of the device may be limited.

DISCLOSURE OF THE INVENTION

In light of the above-described problems, a main object of the present invention is to provide a linear light source with reduced size and thickness which makes it possible to improve the luminance, in particular, keep the luminance uniform and reduce variations in luminance irrespective of the number of the light emitting elements, a method for manufacturing the same and a surface emitting device.

In order to achieve the object, the linear light source of the present invention includes: a square rod-shaped wiring board having a component side; a plurality of light emitting elements which are arranged on the component side of the wiring board at certain intervals along the longitudinal direction of the wiring board and die-bonded thereto; and a plurality of reflectors which are arranged at both sides of each of the light emitting elements on the component side of the wiring board such that the reflectors and the light emitting elements are arranged alternately; wherein the reflectors have opposing surfaces facing each other and the opposing surfaces of the reflectors are inclined such that the distance between the opposing surfaces increases in the direction of light emitted out of the light emitting element.

According to the structure, unlike the first conventional embodiment in which the light emitting elements are contained in the cases, the light emitting elements are arranged directly on the wiring board. Therefore, the obtained device is reduced in size. Further, as the light from the light emitting elements are diffused by the reflectors and then emitted out, linear light is obtained with high luminance. Moreover, the reflectors sandwiching each of the light emitting elements allows easy adjustment of the light distribution characteristic of the light source and the luminance of the light source in the longitudinal direction is kept uniform irrespective of the number of the light emitting elements. Thus, high luminance is achieved while the variations in luminance are reduced.

The square rod-shaped wiring substrate includes a substantially plate-like wiring board having a slightly large thickness.

If the opposing surfaces of the reflectors are rectangular or trapezoidal in shape, the following advantages are obtained. For example, when the opposing surfaces of the reflectors are rectangular in shape, the light emitted from the light emitting elements travels almost straight to form narrow linear light. When the opposing surfaces of the reflectors are trapezoidal in shape, the light emitted from the light emitting elements is slightly diffused in the vertical direction, thereby forming a slightly wide linear light with high luminance.

If the linear light source further includes resin seal layers which are formed by filling recesses, each of which is defined by the component side of the wiring board, the light emitting element and the opposing surfaces of the reflectors arranged at both sides of the light emitting element, with a light-transmissive resin sealant, air layers are eliminated from the recesses to improve the efficiency in capturing the light from the light emitting elements. As the resin sealant fills the space around the light emitting elements, the light emitting elements are protected from the surroundings. The resin seal layers may be in the form of a trapezoidal prism, a truncated pyramid or a truncated cone. The side surfaces of the resin seal layers having these three-dimensional structures may be rounded (arc-shaped, corrugated or uneven).

If the end faces of each of the resin seal layers contacting the wiring board and the reflectors are mirror-finished, the light emitted from the light emitting element is reflected on the mirror-finished faces of the resin seal layer and gathered to the face of the resin seal layer for emitting linear light, thereby obtaining linear light with high luminance. The shape of the end faces of the resin seal layer is preferably trapezoidal in shape. The oblique lines of the trapezoid may be curved.

If the end faces of parts of the resin seal layers located between the opposing surfaces of the reflectors are substantially flush with the end faces of the reflectors to provide a single plane, a substantially linear light source is achieved with ease. The end faces of the resin seal layers may be rectangular, oval or rounded rectangular in shape as long as the substantially linear light source is obtained.

If the linear light source further includes a reflection member which is arranged on a region ranging from the end face of the wiring board adjoining to the component side and extending in the longitudinal direction to the tips of the opposing surfaces of the reflectors, the reflection member being made of a reflection sheet or a vapor-deposited film, light emitted from the light emitting elements in the direction orthogonal to the axis of the wiring board is reflected on the reflection member made of a reflection sheet or a vapor-deposited film to be gathered at the faces of the resin seal layers for emitting the linear light. Thus, the linear light with high luminance is obtained.

A method for manufacturing a linear light source according to the present invention includes the steps of: (a) die-bonding light emitting elements which are arranged on a component side of a wiring board at certain intervals; (b) providing, on the component side of the wiring board, a reflector plate which is configured such that reflectors are arranged at both sides of each of the light emitting elements and the opposing surfaces of the reflectors are inclined such that the distance between the opposing surfaces increases in the direction of light emitted out of the light emitting element; (c) filling recesses, each of which is defined by the component side of the wiring board, the light emitting element and the opposing surfaces of the reflectors arranged at both sides of the light emitting element, with a light-transmissive resin sealant after the steps (a) and (b); and (d) cutting a square rod-shaped linear light source from the obtained product such that the reflectors are arranged at both sides of each of the light emitting elements to be arranged alternately with the light emitting elements. The order of the steps (a) and (b) may be altered.

According to the method, a linear light source in the form of a square rod which is easily incorporated in a slimmed and downsized device is obtained.

In the step (d), the obtained product is cut from the back of the wiring board using a blade having a tip in the form of an isosceles triangle when viewed in section such that the square rod-shaped light source has a trapezoidal section. Therefore, a linear light source for emitting wide linear light with high luminance is obtained easily.

A surface emitting device according to the present invention includes: a wiring board; light emitting elements electrically connected to the wiring board; and a light guide plate which captures light from the light emitting elements and emits the light from almost the entire surface thereof, wherein the light emitting elements are die-bonded to the wiring board such that the light exit faces of the light emitting elements are parallel to the side surface of the light guide plate.

According to the structure, unlike the first conventional embodiment in which the light emitting elements are contained in the cases, the light emitting elements are arranged directly on the wiring board. Therefore, light emitted from the light emitting elements toward the side surface of the light guide plate is easily captured into the light guide plate the light from the light emitting elements is captured into the light guide plate with high efficiency without attenuation of emission intensity.

If the centers of the light exit faces of the light emitting elements are at the same level as the longitudinal center line of the side surface of the light guide plate, a portion of the light from the light emitting elements having the highest luminance travels through the side surface of the light guide plate. As a result, the efficiency in capturing the light into the light guide plate further increases.

If the wiring board is shaped into a square rod corresponding to the thickness of the light guide plate and the longitudinal axis of the wiring board is parallel to the side surface of the light guide plate, the thickness of the entire device is determined by the thickness of the light guide plate. Therefore, the surface emitting device is reduced in thickness. Further, since the wiring board is in the form of a square rod, space for the wiring board is reduced, thereby downsizing the entire device.

As described above, according to the linear light source of the present invention, a plurality of light emitting elements are arranged on a narrow square rod-shaped wiring board at certain intervals along the longitudinal direction and die-bonded thereto. Therefore, the range of light distribution of the light emitting elements is enlarged irrespective of the packaging accuracy. Moreover, the reflectors are arranged at both sides of each of the light emitting elements such that the reflectors and the light emitting elements are arranged alternately and the reflectors have opposing surfaces inclined such that the distance between the opposing surfaces increases in the direction of light emitted out of the light emitting element. Therefore, the lights emitted from the light emitting elements are diffused to overlap each other.

As the opposing surfaces of the reflectors are rectangular or trapezoidal in shape, the width of linear light is changed with ease.

Further, resin seal layers which are formed by filling recesses, each of which is defined by the component side of the wiring board, the light emitting element and the opposing surfaces of the reflectors arranged at both sides of the light emitting element, with a light-transmissive resin sealant. Therefore, improvement in luminance and protection of the light emitting elements are achieved effectively.

In each of the resin seal layers, the end faces of parts of the resin seal layers, each of which is defined by the wiring board and the reflectors, are mirror-finished and the end faces of parts of the resin seal layers located between the opposing surfaces of the reflectors are substantially flush with each other. Therefore, the linear light source with high efficiency in capturing light is obtained with ease.

Further, a reflection member made of a reflection sheet or a vapor-deposited film is arranged on a region ranging from the end face of the wiring board adjoining to the component side and extending in the longitudinal direction to the tips of the opposing surfaces of the reflectors. As a result, linear light with higher luminance is obtained.

Since the linear light source of the present invention is in the form of a square rod, the linear light source is easily incorporated into a housing of a slimmed and downsized cellular phone or digital camera.

If the section of the square rod-shaped linear light source is trapezoidal, wide linear light is emitted, thereby improving the luminance with efficiency.

According to the surface emitting device of the present invention, the light emitting elements are die-bonded to the narrow rod-shaped wiring board such that the light exit faces of the light emitting elements are parallel to the side surface of the light guide plate. Therefore, the efficiency in capturing the light into the light guide plate improves.

Further, the centers of the light exit faces of the light emitting elements are at the same level as the longitudinal center line of the side surface of the light guide plate such that a portion of light having the highest luminance is captured from the side surface of the light guide plate. Therefore, the luminance of the light emitting surface of the light guide plate improves with efficiency.

Still further, since the wiring board is shaped into a narrow square rod corresponding to the thickness of the light guide plate and the longitudinal axis of the wiring board is parallel to the side surface of the light guide plate, the device is slimmed down and downsized with efficiency.

BEST MODE FOR CARRYING OUT THE INVENTION

As a best mode for carrying out the present invention, the following first and second embodiments will be explained with reference to FIGS. 1 to 5.

A linear light source according to the first embodiment of the present invention includes a plurality of light emitting elements arranged on a narrow square rod-shaped wiring board along the longitudinal direction thereof and reflectors arranged at both sides of each of the light emitting elements such that the light emitting elements and the reflectors are arranged alternately. The opposing surfaces of the reflectors are inclined such that the distance between the opposing surfaces increases in the direction of light emitted out of the light emitting element. Further, recesses, each of which is defined by the wiring board, light emitting element and reflectors, are filled with a light-transmissive resin sealant, thereby eliminating air layers from the recesses. Moreover, a strip-shaped reflection member is provided to cover a region ranging from the end face of the wiring board adjoining to the component side thereof to the ends of the reflectors. The rectangular faces of the resin seal layers sandwiched between the ends of the reflectors are flush with each other. The linear light source with the above-described structure achieves high luminance and fewer variations in luminance.

Figure 1A:
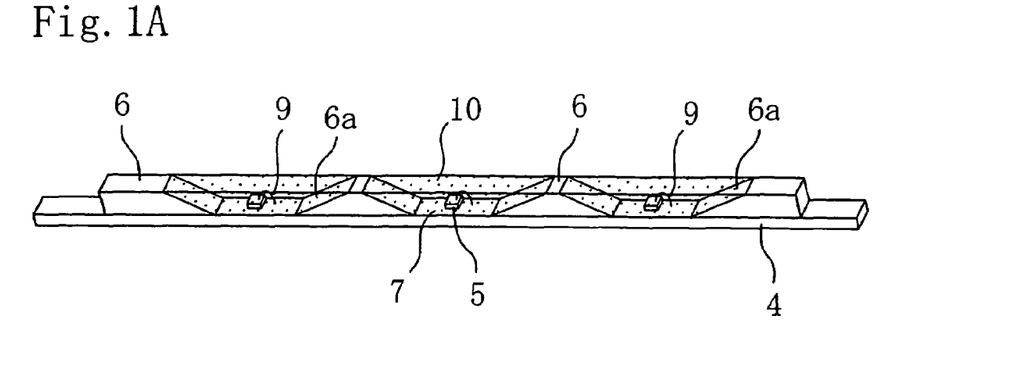
FIG. 1A is an oblique view illustrating a linear light source according to the first embodiment of the present invention.
Figure 1B:
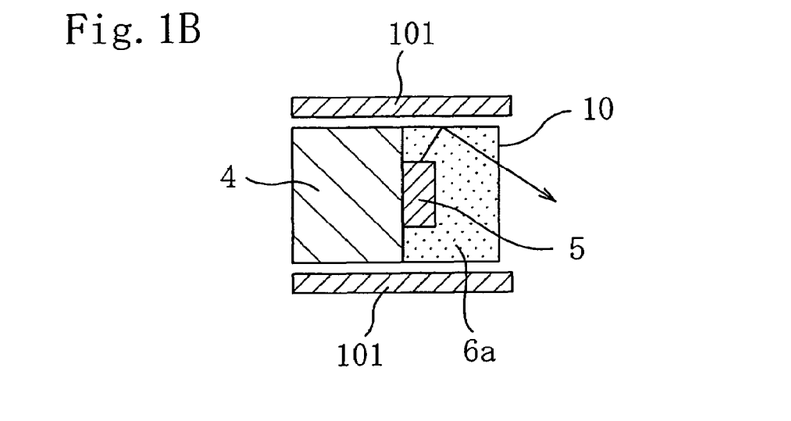
FIG. 1B is a vertical section illustrating the linear light source provided with reflection sheets and FIG. 1C is a vertical section illustrating the linear light source provided with vapor-deposited films.
Figure 1C:
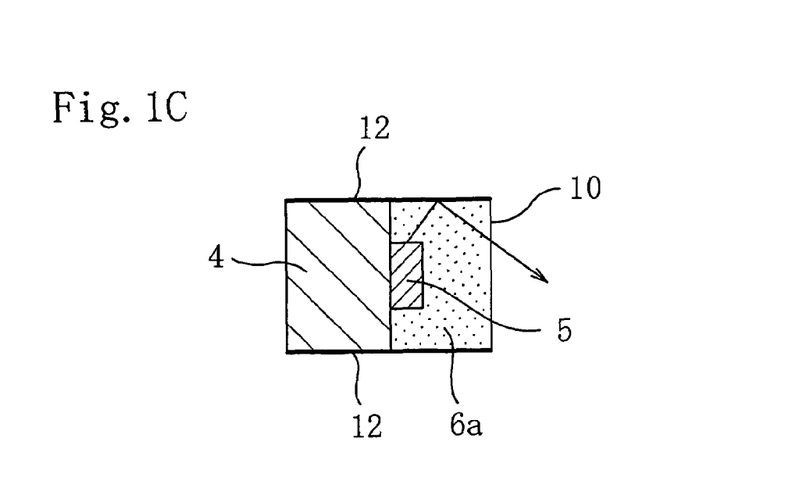

FIG. 1A is an oblique view illustrating the linear light source according to the first embodiment of the present invention, FIG. 1B is a vertical section illustrating the linear light source provided with reflection sheets and FIG. 1C is a vertical section illustrating the linear light source provided with vapor-deposited films.

Figure 2A:
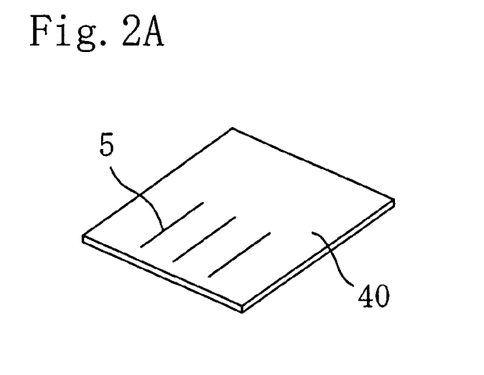
FIG. 2A is an oblique view illustrating a plurality of light emitting elements arranged on a wiring board.
Figure 2B:
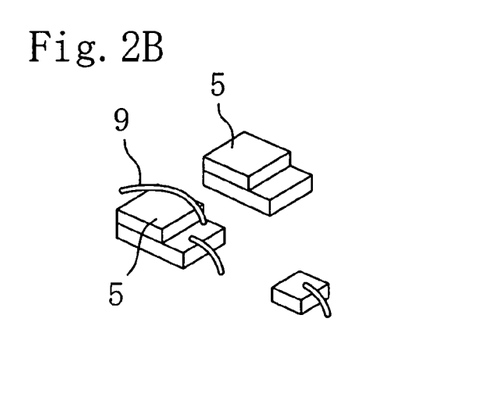
FIG. 2B is an oblique view illustrating the light emitting elements which are die-bonded.
Figure 2C:
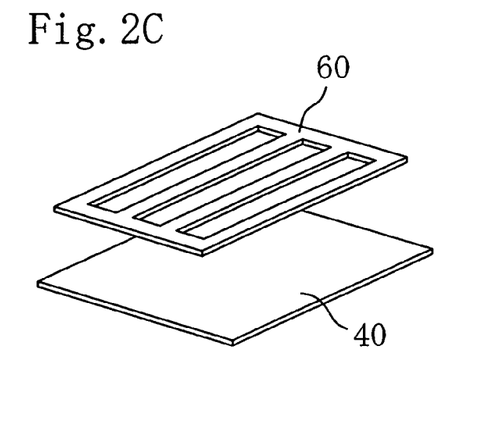
FIG. 2C is an oblique view illustrating the wiring board and a reflector plate to be adhered to the wiring board.
Figure 2D:
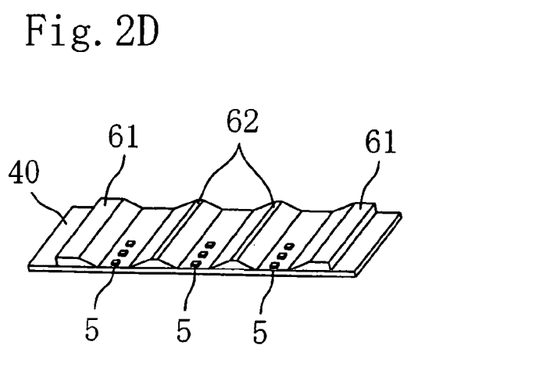
FIG. 2D is an oblique view illustrating a partial enlargement of FIG. 2C.
Figure 2E:
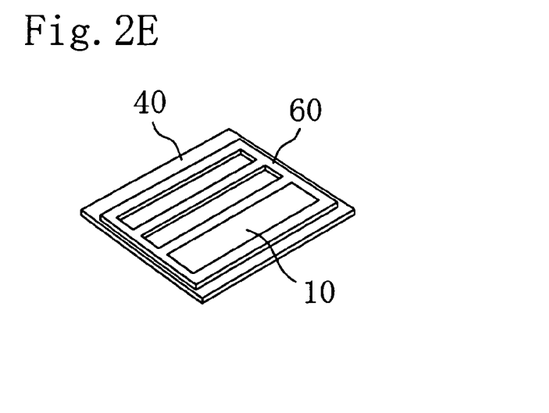
FIG. 2E is an oblique view illustrating a resin sealant filling a recess in the reflector plate and FIG. 2F is an oblique view illustrating how the cutting is carried out.
Figure 2F:
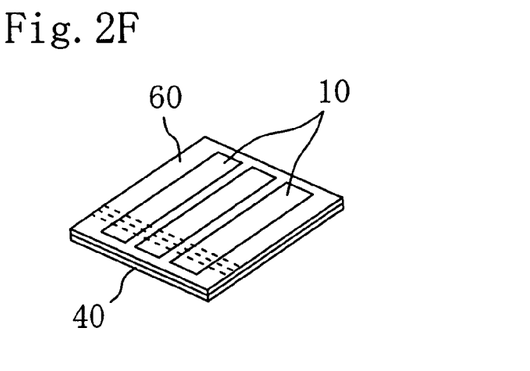

FIGS. 2A to 2F are oblique views illustrating the steps of manufacturing the linear light source according to the first embodiment of the present invention. FIG. 2A is an oblique view illustrating a plurality of light emitting elements arranged on a wiring board, FIG. 2B is an oblique view illustrating the light emitting elements which are die-bonded, FIG. 2C is an oblique view illustrating the wiring board and a reflector plate to be adhered to the wiring board, FIG. 2D is an oblique view illustrating a partial enlargement of FIG. 2C, FIG. 2E is an oblique view illustrating a resin sealant filling a recess in the reflector plate and FIG. 2F is an oblique view illustrating how the cutting is carried out.

Figure 3A:
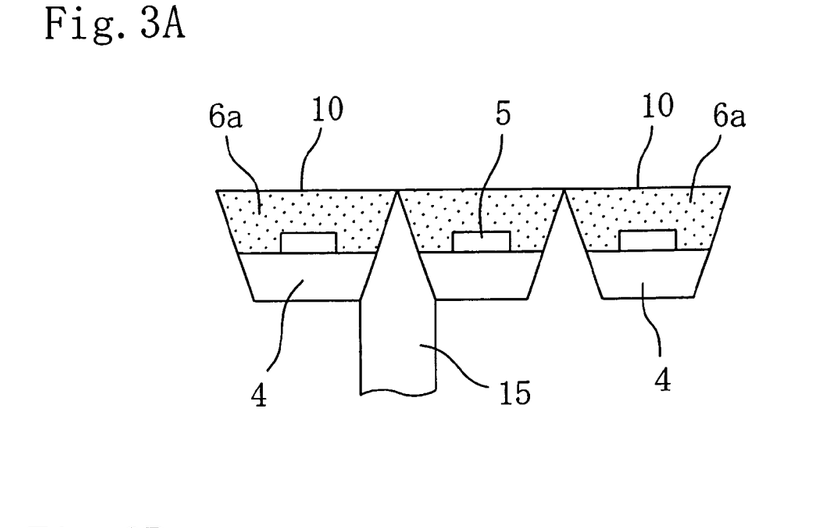
FIG. 3A is a vertical section observed from the side illustrating how a blade having a tip in the form of an isosceles triangle cuts the wiring board from the back.
Figure 3B:
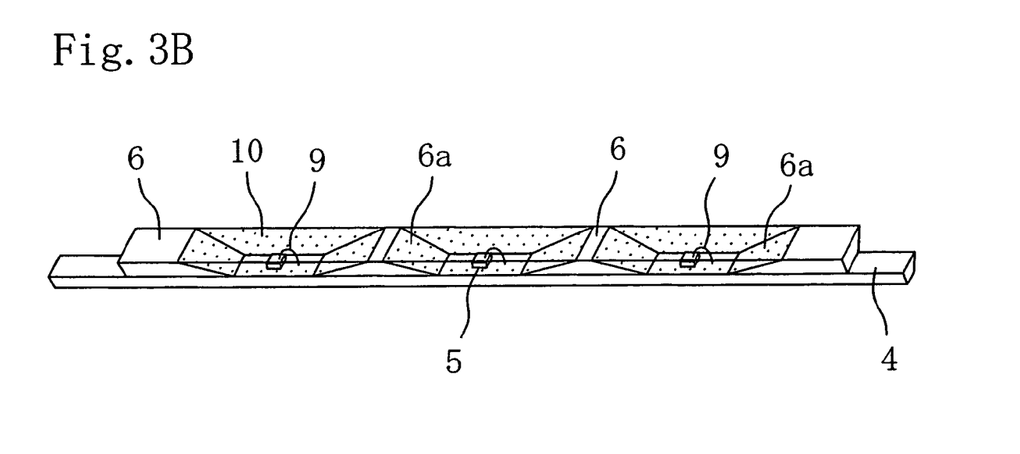
FIG. 3B is an oblique view illustrating a linear light source including resin seal layers in the form of a truncated pyramid and FIG. 3C is a vertical section of FIG. 3B.
Figure 3C:
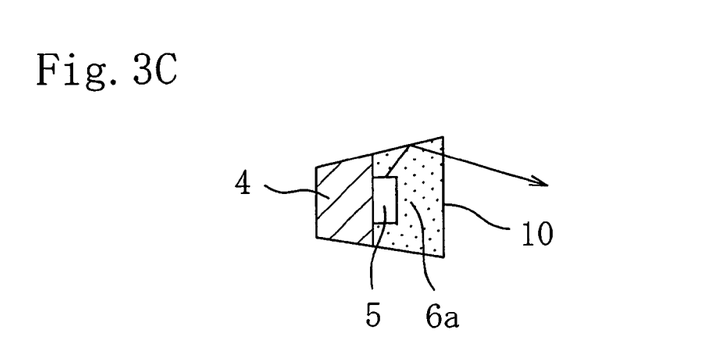

FIG. 3A is a vertical section illustrating how a blade having a tip in the form of an isosceles triangle cuts the wiring board from the back, FIG. 3B is an oblique view illustrating the linear light source having resin seal layers in the form of a truncated pyramid and FIG. 3C is a vertical section of FIG. 3B.

As shown in FIGS. 1 to 3, the surface emitting device according to the first embodiment includes a narrow square rod-shaped printed board 4 serving as the wiring board, a plurality of light emitting elements 5 arranged on the printed board 4 at certain intervals, reflectors 6 arranged at both sides of each of the light emitting elements 5, light-transmissive resin seal layers 10 for filling recesses 7, each of which is defined by the reflectors 6 and the printed board 4 and in the form of a trapezoidal prism, and strip-shaped reflection sheets 101 serving as reflection members which are adhered to regions ranging from the top and bottom surfaces of the printed board 4 to the ends of the reflectors 6, respectively.

As shown in FIG. 1A, the printed board 4 is in the form of a narrow square rod which is cut from a printed board 40 in the square form when viewed in plan as shown in FIG. 2A. On the component side thereof, a plurality of light emitting elements 5 are arranged in line at certain intervals along the longitudinal direction of the narrow square rod-shaped printed board 4. At both ends of the printed board 4, plus and minus electrode terminals for carrying current to the light emitting elements 5 are drawn out (not shown).

Each of the light emitting elements 5 is capable of emitting white light with use of a GaN compound semiconductor, for example, and includes an n-type layer and a p-type layer which are epitaxially grown on a transparent sapphire substrate. An n-type electrode and a p-type electrode are formed on the n-type layer and the p-type layer, respectively. Both of the electrodes are die-bonded to a wiring pattern on the printed board 4 via wires 9. Thus, the light emitting elements 5 covered with transparent resin containing fluorescent material are electrically connected in series.

The reflectors 6 are obtained by cutting a reflector plate 60 including a plurality of ribs 61 in the form of a trapezoidal prism and a plurality of ribs 62 which are in the form of a substantially symmetrical trapezoidal prism shown in FIG. 2D such that the reflectors 6 are arranged at both sides of each of the light emitting elements 5, i.e., the reflectors 6 and the light emitting elements 5 are arranged alternately. The thickness of the thus cut reflectors 6 and the thickness of the narrow, square rod-shaped printed board 4 are substantially the same (for example, in the range of 0.3 to 1.0 mm). The surfaces 6a (opposing surfaces) of the reflectors 6 sandwiching the light emitting element 5 are inclined such that the distance between the inclined surfaces 6a increases in the direction of light emitted out of the light emitting element 5. Accordingly, the light from the light emitting element 5 is reflected from and diffused by the inclined surfaces 6a of the reflectors 6. Therefore, even if the light of the emitting elements 5 is poor in luminance, the diffused rays of light overlap each other, thereby keeping the luminance as uniform as possible. The inclined surfaces 6a of the reflectors 6 are rectangular in shape. The angle of inclination may suitably be adjusted such that the variations in luminance are minimized.

The resin seal layers 10 are formed by filling the recesses 7 with a transparent resin sealant such as epoxy resin. By forming the resin seal layers 10 to fill the recesses 7, each of which is defined by the printed board 4, light emitting element 5 and the reflectors 6, air layers in the recesses 7 are eliminated by the resin sealant, thereby improving efficiency in capturing the light from the light emitting elements 5.

Each of the resin seal layers 10 is in the form of a trapezoidal prism and has a face in the same shape as the component side of the printed board 4 on which the light emitting element is mounted, faces having the same shape as the inclined surfaces 6a of the reflectors 6, trapezoidal faces defined between the edge of the printed board 4 and the tips of the inclined surfaces 6a of the reflectors 6 and a rectangular face formed between the tips of the inclined surfaces 6a of the opposing reflectors 6. The trapezoidal faces of the resin seal layers 10 are mirror-finished to improve reflection efficiency. The rectangular faces of the resin seal layers 10 form a substantially one narrow surface, thereby providing a substantially linear light emitting surface.

Each of the reflection sheets 101 is a mirror-finished tape or a white tape made of highly reflective material. The reflection sheet 101 covers a region ranging from the end face (top and bottom surfaces) of the printed board 4 adjoining to the component side to the tips of the inclined surfaces 6a of the reflectors 6. Therefore, portions of light emitted upward and downward from the light emitting elements 5 are reflected from the reflection sheets 101 to travel forward, thereby achieving linear light emission from the light emitting surface.

Now, an explanation of how the linear light source is used will be provided. When the light emitting elements 5 are energized through the wiring pattern on the printed board 4, active layers in semiconductor layers of the light emitting elements 5 emit light. The light of the active layers radiates from the light exit planes of the light emitting elements 5, i.e., the planes on which the electrodes bonded with the wires 9 are formed.

Among light emitted from the light emitting elements 5, a portion of light emitted upward and downward is reflected from the reflection sheets 101 to travel forward, a portion of light emitted forward travels straight and a portion of light emitted leftward and rightward is reflected from the inclined surfaces 6a of the reflectors 6 arranged at both side of each of the light emitting elements 5 and diffused forward. As the light emitted leftward and rightward is diffused in this way, the light emitting elements 5 complement the luminance each other, thereby achieving uniform luminance. Further, as the light emitting elements 5 are sealed with the resin, the efficiency in capturing the light improves, thereby increasing the luminance.

Next, an explanation of a method for manufacturing the linear light source will be provided with reference to FIGS. 2A to 2F. Prior to the step shown in FIG. 2A, a conductive pattern made of copper foil is formed on a white glass BT (bismaleimide triazine) serving as the printed board 40.

In the step shown in FIG. 2A, the light emitting elements 5 are arranged on the component side of the printed board 40 which is in the square form when viewed in plan and mechanically bonded thereto with an adhesive.

Then, in the step shown in FIG. 2B, the light emitting elements 5 are die-bonded and then pad electrodes (not shown) of the light emitting elements 5 and the conductive pattern are electrically connected via wires. Then, in the step shown in FIG. 2C, a reflector plate 60 molded from a resin such as LCP (liquid crystal polymer) or PPA (polyphthalamide) is bonded to the printed board 40 with an adhesive. As shown in FIG. 2D, the reflector plate 60 includes ribs 61 each having a trapezoidal section at both ends thereof and a plurality of ribs 62 each having a substantially symmetrical trapezoidal section between the ribs 61. In the step shown in FIG. 2E, the recesses 7, each of which is defined by the printed board 4 and the inclined surfaces 6a of the reflectors 6, are filled with a transparent resin sealant 10 to seal the light emitting elements 5. Then, the printed board 40 which is in the square form when viewed in plan is cut along broken lines indicated in FIG. 2F into narrow square rods.

Through these steps, the linear light source shown in FIG. 1A is obtained. Subsequently, the trapezoidal faces of each of the resin seal layers which are defined by the edges of the narrow, square rod-shaped printed board 4 and the edges of the inclined surfaces 6a of the reflectors 6 are mirror-finished. For example, with a polishing blade of 800 grain size or more, the trapezoidal faces are mirror-finished at a rotational speed of 20,000 to 30,000 rpm and a cutting speed of 5 mm/sec. Alternatively, the mirror-finishing may be carried out with abrasives.

Then, as shown in FIG. 1B, the reflection sheets 101 are arranged to cover regions ranging from the end faces of the printed board 4 (top and bottom surfaces) adjoining to the component side thereof to the tips of the inclined surfaces 6a of the reflectors 6, respectively.

In the first embodiment, the reflection sheets 101 are arranged to cover regions ranging from the end faces of the printed board 4 (top and bottom surfaces) adjoining to the component side thereof to the tips of the inclined surfaces 6a of the reflectors 6, respectively, as shown in FIG. 1B. However, as shown in FIG. 1C, the regions may be covered with vapor-deposited films 12 made of sliver or aluminum. In this case, thin films are formed by sputtering or vacuum deposition in a thickness of about several μm. The thin films also improve the luminance as the reflection sheets 101 do. The vapor-deposited films 12 may be formed after the mirror-finishing.

In the first embodiment, the inclined surfaces 6a of the reflectors 6 are rectangular in shape and the resin seal layers are in the form of a trapezoidal prism. However, as shown in FIG. 3A, the printed board 40 may be cut from the back using a blade 15 having a tip in the form of an isosceles triangle such that the inclined surfaces 6a of the reflectors 6 become trapezoidal in shape and the resin seal layers are shaped into a truncated pyramid (see FIG. 3B). In this case, as shown in FIG. 3C, the light is diffused more widely in the horizontal and vertical directions as compared with the case shown in FIGS. 1B and 1C, thereby achieving a wide and linear light emitting surface with high luminance. Even if the inclined surfaces 6a of the reflectors 6 are trapezoidal in shape and the resin seal layers are in the form of a truncated pyramid, the mirror finishing of the trapezoidal faces of the resin seal layers, the adhesion of the reflection sheets 101 and the formation of the vapor-deposited films 12 may be carried out.

Second Embodiment

According to the second embodiment of the present invention, the light exit faces of the die-bonded light emitting elements and the wiring board to which the light emitting elements are die-bonded are arranged parallel to the side surface of the light guide plate, thereby improving the efficiency in capturing light into the light guide plate. Moreover, two reflectors which are arranged at both sides of each of the light emitting elements are inclined such that the distance between the opposing surfaces increases toward the side surface of the light guide plate, thereby capturing the light of the light emitting element emitted along the longitudinal direction of the side surface of the light guide plate into the light guide plate. Further, recesses, each of which is defined by the wiring board, the light emitting element and the two reflectors, are filled with a resin sealant to eliminate air layers from the recesses. In addition, a plate-like reflection sheet is arranged to cover a region ranging from one of the light emitting surfaces of the light guide plate to the wiring board and a strip-shaped reflection sheet is arranged to cover a region ranging from the end of the other light emitting surface of the light guide plate to the wiring board. With the above-described structure, the luminance of the light emitting surface of the light guide plate improves and the luminance is kept uniform.

Figure 4:
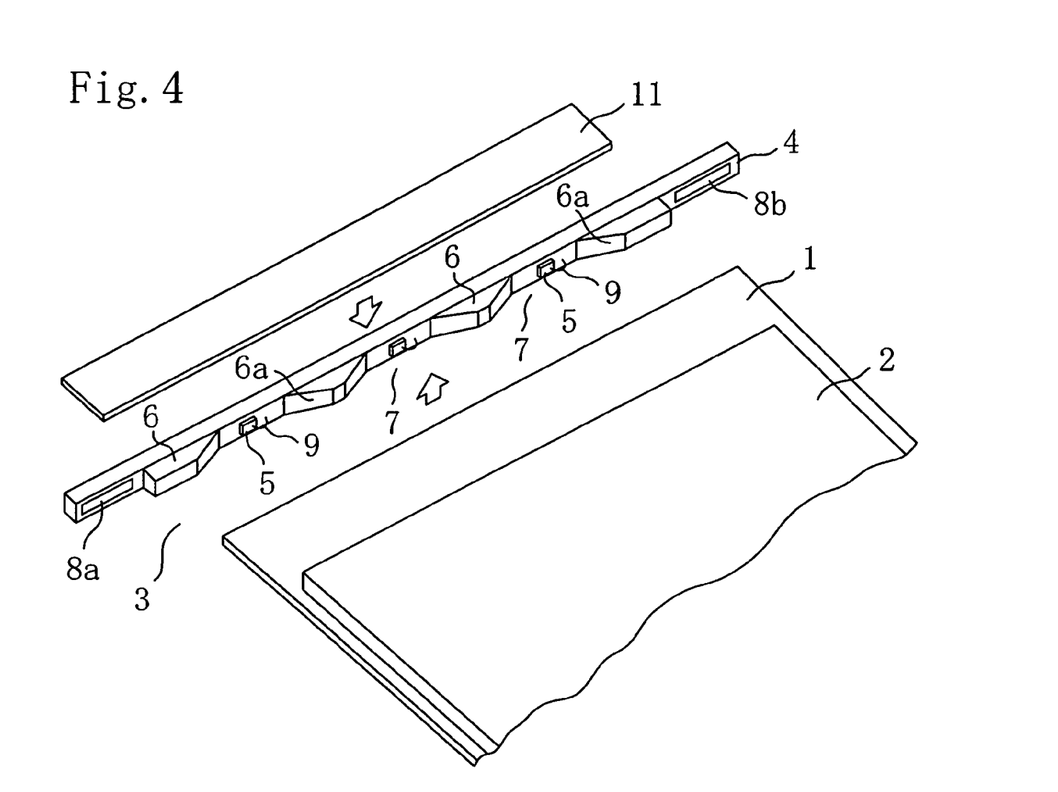
FIG. 4 is an oblique view illustrating a surface emitting device according to the second embodiment of the present invention.
Figure 5:
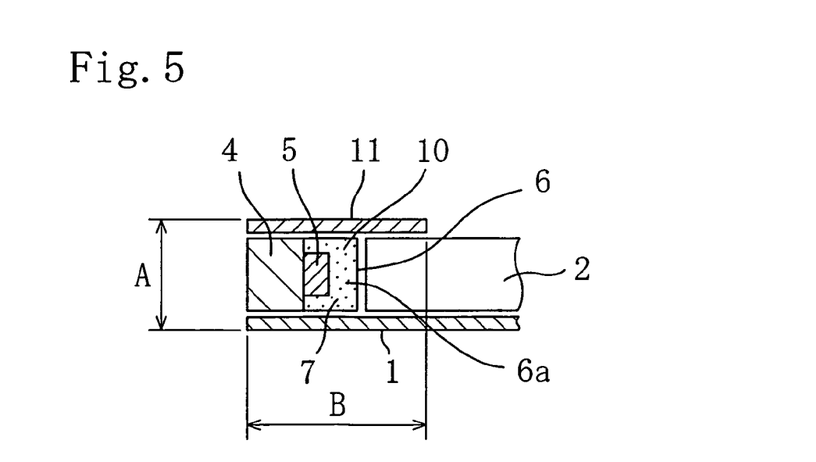
FIG. 5 is a vertical section of a major part illustrating how the light emitting element is mounted and how the light guide plate and the printed board are connected.

FIG. 4 is an oblique view illustrating the structure of a surface emitting device according to the second embodiment of the present invention. FIG. 5 is a vertical section of a major part illustrating how the element is mounted and how the light guide plate and the printed board are connected. In FIGS. 4 and 5, the components same as or corresponding to those shown in FIGS. 1 to 3 are indicated by the same reference numerals.

The surface emitting device according to the second embodiment includes, as shown in FIGS. 4 and 5, a bottom reflection sheet 1 which is rectangular in shape when viewed in plan, a plate-like light guide plate 2 which is adhered to the top surface of the bottom reflection sheet 1 while one of the ends of the bottom reflection sheet 1 is left exposed, a linear light source 3 which is arranged on the exposed end of the bottom reflection sheet 1 along the side surface of the light guide plate 2 and a narrow strip-shaped top reflection sheet 11 which is adhered to cover the linear light source 3 and the top surface of the light guide plate 2, i.e., the end of the light emitting surface thereof.

The bottom reflection sheet 1 is, for example, a mirror-finished tape or a white tape made of highly reflective material. The bottom reflection sheet 1 covers a region ranging from the light guide plate 2 to the printed board 4, specifically, from one of the light emitting surfaces of the light guide plate 2 to the bottom surface of the printed board 4. Accordingly, light emitted downward from the linear light source 3 is reflected from the bottom reflection sheet 1 to the inside of the light guide plate 2.

The light guide plate 2 is, for example, a 0.3 to 1.0 mm thick transparent plate made of acrylic resin or polycarbonate resin. A liquid crystal display panel (not shown) is placed above the light guide plate 2 to face the light emitting surface. In other words, the light guide plate 2 is arranged to face the bottom surface of the liquid crystal display panel.

The linear light source 3 includes a narrow square rod-shaped printed board 4 which serves as a wiring board and is arranged to align its axis parallel to the side surface of the light guide plate 2, light emitting elements 5 which are arranged on the side surface of the printed board 4 facing the side surface of the light guide plate 2 at certain intervals along the side surface of the light guide plate 2, reflectors 6 which are trapezoidal in shape when viewed in plan and arranged at both sides of each of the light emitting elements 5 on the surface of the printed board 4 and resin seal layers 10 which fill recesses 7, each of which has an almost trapezoidal section and defined by the printed board 4, light emitting element 5 and reflectors 6.

The printed board 4 is cut from a plate-shaped printed board on which the light emitting elements 5 are arranged in matrix to correspond to the thickness of the light guide plate 2. On the thus cut printed board 4, the light emitting elements 5 are aligned in the horizontal direction. The thickness of the printed board 4 is substantially the same as the thickness of the light guide plate 2. The thickness of the print board 4 determines the thickness A of the surface emitting device. In the present embodiment, unlike the first conventional embodiment described above, the light emitting elements 5 are formed not on the flexible substrate, but on the bottom reflection sheet 1. Therefore, as compared with the thickness A' of the surface emitting device shown in FIG. 7, the thickness A of the surface emitting device is significantly reduced. At both ends of the printed board 4, plus and minus electrode terminals 8a and 8b for carrying current to the light emitting elements 5 are drawn out. The terminals 8a and 8b are electrically connected to the circuit of a main device such as a cellular phone (not shown).

Each of the light emitting elements 5 is capable of emitting white light with use of a GaN compound semiconductor, for example. The light emitting element 5 includes an n-type layer and a p-type layer which are epitaxially grown on a transparent sapphire substrate. An n-type electrode and a p-type electrode are formed on the n-type layer and the p-type layer, respectively. Both of the electrodes are bonded to a wiring pattern on the printed board 4 via wires 9. Thus, the light emitting elements 5 covered with transparent resin containing fluorescent material are electrically connected in series. The light emitting elements 5 are arranged such that the light exit surfaces thereof are parallel to the side surface of the light guide plate 2. The horizontal light axes of the light emitting elements 5 are aligned in line and positioned at the same level as the longitudinal center line of the side surface of the light guide plate 2.

The reflectors 6 have inclined surfaces 6a which are arranged at both sides of each of the light emitting elements 5 and configured such that the distance between the inclined surfaces 6a increases toward the side surface of the light guide plate 2. Light from each of the light emitting elements 5 is reflected from and diffused by the inclined surfaces 6a of the reflectors 6 to enter the light guide plate 2 from the side surface. The light from the light emitting element 5 is diffused widely to travel into the light guide plate 2 through the side surface. Therefore, even if the light of the light emitting elements 5 is poor in luminance, the diffused rays of light from the light emitting elements 5 overlap each other, thereby keeping the luminance of the linear light source 3 uniform. As a result, the luminance of the surface emission by the light guide plate 2 becomes almost uniform. The angle of inclination may suitably be adjusted as required such that the variations in luminance are eliminated.

The resin seal layers 10 are made of a transparent resin sealant such as epoxy resin. By filling the recesses 7, each of which is defined by the printed board 4, light emitting element 5 and the reflectors 6, with the resin sealant, air layers in the recesses 7 are eliminated by the resin sealant, thereby improving the efficiency in capturing the light from the light emitting elements 5 into the light guide plate 2.

The top reflection sheet 11 is made of substantially the same material as that for the bottom reflection sheet 1. The top reflection sheet 11 covers a region ranging from the end of the light guide plate 2 to the printed board 4. Specifically, the top reflection sheet 11 covers the end of the light guide plate 2 close to the light emitting elements 5, the top of the light emitting elements 5, the top faces of the reflectors 6 and the top face of the printed board 4. Thus, portions of light emitted upward and downward from the light emitting elements 5 are reflected from the bottom and top reflection sheets 1 and 2 into the light guide plate 2 without leaking the light from the gap between the light guide plate 2 and the linear light source 3. Therefore, almost all the light emitted from the light emitting elements 5 enters the light guide plate 2. Further, since the printed board 4 is covered with the top reflection sheet 11 so as not to be exposed and the width B of the top reflection sheet 11 is the same as the width of space for the light source 3, the width B of the space for the light source 3 is significantly reduced as compared with the width B' of the space for the light source 22 of the surface emitting device shown in FIG. 7.

Now, an explanation of how the surface emitting device is used will be provided. When the light emitting elements 5 are energized through the wiring pattern on the printed board 4, active layers in semiconductor layers of the light emitting elements 5 emit light. The light of the active layers radiates from the light exit planes of the light emitting elements 5, i.e., the planes having the electrodes to which the wires 9 are bonded.

A portion of light emitted in the direction orthogonal to the side surface of the light guide plate 2 travels straight in the light guide plate 2, a portion of light emitted in the direction parallel to the side surface of the light guide plate 2 is reflected from the inclined surfaces 6a of the reflectors 6 to the inside of the light guide plate 2 and a portion of light emitted upward or downward from the light exit faces of the light emitting elements 5 is reflected from the top or bottom reflection sheet 11 or 1 to the inside of the light guide plate 2.

As the light radiated from the light emitting elements 5 is captured in the light guide plate 2 in this way, the luminance of the light emitting surface of the light guide plate 2 does not vary and is kept uniform. Further, as the light emitting elements 5 are sealed with the resin, the efficiency in capturing the light into the light guide plate 2 improves, thereby increasing the luminance.

Next, an explanation of a method for manufacturing the surface emitting device will be provided. First, a conductive pattern made of copper foil is formed on a white glass BT (bismaleimide triazine) serving as the printed board 40. Then, a reflector plate (serving as the inclined surface 6a of the reflector 6 in the embodiments) is molded from a resin such as LCP (liquid crystal polymer) or PPA (polyphthalamide) and bonded to the conductive pattern on the printed board 40 with an adhesive. Then, the light emitting elements 5 are bonded to certain positions on the printed board 40 with an adhesive. The light emitting elements 5 are then die-bonded to establish electrical connection and sealed with a transparent resin. Then, the obtained product is cut into square rods corresponding to the thickness of the light guide plate 2.

Then, the light guide plate 2 is adhered to the plate-like bottom reflection sheet 1 while the end of the bottom reflection sheet 1 is left exposed. The square rod-shaped printed board 4 is arranged such that the printed board 4 and the light exit faces of the light emitting elements 5 are parallel to the side surface of the light guide plate 2. The plate-like bottom reflection sheet 1 covers a region ranging from one of the light emitting surfaces of the light guide plate 2 to the printed board 4, while the strip-shaped top reflection sheet 11 is arranged to cover a region ranging from the end of the other light emitting surface of the light guide plate 2 to the printed board 4.

In the second embodiment, the inclined surfaces 6a of the reflectors 6 which are trapezoidal in shape when viewed in plan are used for reflecting light. However, the structure for reflecting the light is not limited to the one illustrated in the figures. For example, the inclined surfaces of the reflectors may be triangular in shape when viewed in plan, or reflector plates cut into narrow strips may be used. In any case, it is preferred that the reflectors are configured such that the angle of inclination of the inclined surfaces is adjustable. In summary, the shape and angle of the reflectors are not particularly limited as long as the light from the light emitting elements 5 is reflected satisfactorily and the diffused rays of light from the adjacent light emitting elements 5 overlap each other in a large area. By so doing, the luminance of the light emitting elements 5 is complemented even if it is poor and the luminance of the surface emission by the light guide plate 2 becomes almost uniform.

The light-transmissive resin seal layers 10 may contain light dispersion material such as glass beads to improve the luminance of the light guide plate 2.

In the second embodiment, the strip-shaped top reflection sheet 11 is arranged to cover a region ranging from the end of the light guide plate 2 to the printed board 4. However, a substantially U-shaped or flame-shaped top reflection sheet may be used to cover a region ranging from the periphery of the light guide plate 2 to the printed board 4.

Thus, as described above, according to the second embodiment, the light emitting elements are die-bonded to the wiring board and the light exit faces of the die-bonded light emitting elements are arranged parallel to the side surface of the light guide plate. Therefore, the efficiency in capturing the light into the light guide plate improves.

Further, as the centers of the light exit faces of the light emitting elements are positioned at the same level as the longitudinal center line of the side surface of the light guide plate such that a portion of light from the light emitting elements having the highest luminance enters the light guide plate through the side surface. Therefore, the luminance of the light emitting surface of the light guide plate improves effectively.

The wiring board is shaped into a square rod corresponding to the thickness of the light guide plate and the wiring board is arranged to bring the axis parallel to the side surface of the light guide plate. Therefore, the device is effectively reduced in thickness and size.

Since the two reflectors are arranged at both sides of each of the light emitting elements and their opposing surfaces are inclined such that the distance between the opposing surfaces increases toward the side surface of the light guide plate, the light of the light emitting elements emitted along the longitudinal direction of the side surface of the light guide plate is captured into the light guide plate. Therefore, the distribution of light from the light source is freely adjusted by the reflectors, thereby eliminating the variations in luminance of the light guide plate improving the luminance of the light guide plate.

The recesses, each of which is defined by the wiring board, light emitting element and two reflectors, are filled with a light-transmissive resin sealant so as to eliminate air layers from the recesses and improve the efficiency in capturing light to a further extent. As a result, the luminance improves.

Further, the plate-like reflection sheet is arranged to cover a region ranging from one of the light emitting surfaces of the light guide plate to the wiring board. Another reflection sheet is arranged to cover a region ranging from the end of the other light emitting surface of the light guide plate to the wiring board, or a region ranging from the periphery of the other light emitting surface of the light guide plate to the wiring board. Therefore, light of the light emitting elements emitted in the direction orthogonal to the light emitting surfaces of the light guide plate is reflected from the two reflection sheets to the inside of the light guide plate. Thus, the luminance of the light emitting surface of the light guide plate improves efficiently.

INDUSTRIAL APPLICABILITY

The linear light source and the surface emitting device according to the present invention are applicable to a backlight for a liquid crystal display panel of a down-sized and slimmed cellular phone or digital camera and may serve as a display part that achieves high luminance and fewer variations in luminance.

The invention claimed is:

1. A linear light source comprising:
   a square rod-shaped wiring board having a component side;
   a plurality of light emitting elements which are arranged on the component side of the wiring board at certain intervals along the longitudinal direction of the wiring board and die-bonded thereto; and
   a plurality of reflectors which are arranged at both sides of each of the light emitting elements on the component side of the wiring board such that the reflectors and the light emitting elements are arranged alternately; wherein
   adjacent two reflectors have opposing surfaces facing each other with the light emitting element sandwiched therebetween,
   the opposing surfaces of the reflectors are inclined such that the distance between the opposing surfaces increases in the direction of light emitted out of the light emitting element, and
   open-ended channels are formed, each of which is defined by the component side of the wiring board and the adjacent two reflectors arranged at both sides of each of the light emitting elements.

2. A linear light source according to claim 1, wherein the opposing surfaces of the reflectors are rectangular or trapezoidal in shape.

3. A linear light source according to claim 1 further comprising resin seal layers which are formed by filling the open-ended channels with a light-transmissive resin sealant.

4. A liner light source according to claim 3, wherein the end faces of each of the resin seal layers contacting the wiring board and the reflectors are mirror-finished.

5. A linear light source according to claim 3, wherein the end faces of the resin seal layers opposite to those facing the wiring board are substantially flush with the end faces of the reflectors to provide a single plane.

6. A linear light source according to claim 1 further comprising a reflection member which is arranged on a region ranging from the end face of the wiring board adjoining to the component side and extending in the longitudinal direction to the tips of the opposing surfaces of the reflectors, the reflection member being made of a reflection sheet or a vapor-deposited film.

7. A method for manufacturing a linear light source comprising the steps of:
   (a) die-bonding light emitting elements which are arranged on a component side of a wiring board at certain intervals;
   (b) providing, on the component side of the wiring board, a reflector plate which is configured such that reflectors are arranged at both sides of each of the light emitting elements and the opposing surfaces of the reflectors are inclined such that the distance between the opposing surfaces increases in the direction of light emitted out of the light emitting element;
   (c) filling open-ended channels, each of which is defined by the component side of the wiring board, the light emitting element and the opposing surfaces of the reflectors arranged at both sides of the light emitting element, with a light-transmissive resin sealant after the steps (a) and (b); and
   (d) cutting a square rod-shaped linear light source from the obtained product such that the reflectors are arranged at both sides of each of the light emitting elements to be arranged alternately with the light emitting elements.

8. A method for manufacturing a linear light source according to claim 7, wherein in the step (d), the obtained product is cut from the back of the wiring board using a blade having a tip in the form of an isosceles triangle when viewed in section such that the square rod-shaped light source has a trapezoidal section.

9. A surface light emitting device comprising:
   a wiring board; a linear light source; and a light guide plate which captures light from the linear light source and emits the light from almost the entire surface thereof,
   wherein the linear light source has:
   a square rod-shaped wiring board having a component side;
   a plurality of light emitting elements which are arranged on the component side of the wiring board at certain intervals along the longitudinal direction of the wiring board and die-bonded thereto; and
   a plurality of reflectors which are arranged at both sides of each of the light emitting elements on the component side of the wiring board such that the reflectors and the light emitting elements are arranged alternately,
   wherein adjacent two reflectors have opposing surfaces facing each other with the light emitting element sandwiched therebetween,
   the opposing surfaces of the reflectors are inclined such that the distance between the opposing surfaces increases in the direction of light emitted out of the light emitting element, and
   open-ended channels are formed, each of which is defined by the component side of the wiring board and the adjacent two reflectors arranged at both sides of each of the light emitting elements, and direction.

10. A surface light emitting device according to claim 9, wherein the centers of the light exit faces of the light emitting elements are at the same level as the longitudinal center line of the side surface of the light guide plate.

11. A surface light emitting device according to claim 9, wherein the wiring board is shaped into a square rod corresponding to the thickness of the light guide plate and the longitudinal axis of the wiring board is parallel to the side surface of the light guide plate.

* * * * *